United States Patent
Chang et al.

(10) Patent No.: US 7,411,381 B2
(45) Date of Patent: Aug. 12, 2008

(54) CIRCUIT CALIBRATION USING A TIME CONSTANT

(75) Inventors: Yuyu Chang, Irvine, CA (US); Hooman Darabi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 214 days.

(21) Appl. No.: 11/446,408

(22) Filed: Jun. 2, 2006

(65) Prior Publication Data

US 2007/0279032 A1 Dec. 6, 2007

(51) Int. Cl.
*G05F 3/16* (2006.01)
(52) U.S. Cl. ...................................................... 323/316
(58) Field of Classification Search ................... None
See application file for complete search history.

(56) References Cited

U.S. PATENT DOCUMENTS

| | | | |
|---|---|---|---|
| 6,628,163 B2 * | 9/2003 | Dathe et al. ................. | 327/553 |
| 6,731,145 B1 * | 5/2004 | Humphreys et al. ......... | 327/156 |
| 6,891,414 B1 * | 5/2005 | Bunch et al. ................. | 327/156 |
| 2007/0194840 A1 * | 8/2007 | Dathe et al. ................. | 327/552 |

* cited by examiner

*Primary Examiner*—Jeffrey L Sterrett
(74) *Attorney, Agent, or Firm*—Brake Hughes Bellermann LLP

(57) ABSTRACT

According to one general aspect, an apparatus includes a first resistor in a first current path of a resistor-capacitor (RC) circuit, the resistor connected to a power source. A variable capacitor is included in a second current path of the RC circuit and operably connected to the power source and a virtual ground generator. A comparison circuit is configured to make a determination regarding a voltage VR across the resistor to a ground relative to a voltage VC across the capacitor to a virtual ground from the virtual ground generator. A control circuit is configured to make an adjustment of a value of the variable capacitor, based on the determination.

20 Claims, 6 Drawing Sheets

CIRCUIT CALIBRATION USING A TIME CONSTANT

TECHNICAL FIELD

This description relates to circuits and the calibration thereof.

BACKGROUND

An RC circuit may include, for example, a circuit with a power or a voltage source (e.g., battery) connected to a resistor (R) and a capacitor (C). RC circuits are found, for example, in many different electronic circuits, e.g., filters and/or phase-locked loops, and may be included, for example, on microchips ("chips") or circuit board-level components. A time constant of an RC circuit, i.e., the RC time constant, generally refers to a time needed for a voltage across the resistor/capacitor to rise (with respect to the capacitor) or fall (with respect to the resistor) to a defined percentage of a final charging or discharging value of the capacitor. The RC time constant thus depends at least on the resistance and capacitance, and, more particularly, is generally directly related to a size of each of R and C.

Construction and use of many on-chip RC circuits, such as, for example, RC filters, may benefit from an accurate time constant, in order, for example, to define associated filter transfer functions independently of, e.g., process variations and temperature fluctuations. In other words, on-chip RC circuits may be constructed and operated with the expectation that a time constant of an RC circuit will equal R*C, as expected in the ideal case. In reality, however, actual values of R and/or C within a given circuit may not match expected values, and, moreover, may change over a period of time (e.g., again, due to temperature fluctuations experienced by the circuit(s)).

Accordingly, RC circuits and related circuits may be calibrated, so that the RC circuit behaves in an expected manner in a known amount of time. For example, a variable resistance and/or variable capacitance may be used, so that periodic adjustments may be made to the RC circuit to cause the actual RC circuit components to function in a predictable way in an expected amount of time.

In one such technique for calibrating an RC circuit, a current mirror may first be used to make sure that the same current flows through a resistor and capacitor that are otherwise connected in parallel within the RC circuit. Then, the capacitance, which may be variable, may be adjusted until the voltages across the resistor and the capacitor equal one another after a time period (i.e., time constant) of R*C from an initial state of charge/discharge of the capacitor, as may be shown to be expected for such a configuration.

Such a current mirror, however, may create a large parasitic capacitance to ground. One technique for minimizing an effect of such a parasitic capacitance is to use a large capacitance for the capacitor of the RC circuit (thereby, relatively speaking, minimizing an effect of the parasitic capacitance). In order to have such a large capacitance, however, it may be necessary to dedicate a relatively large area of a chip on which the filter is constructed to the capacitor(s) in the RC circuit. In such cases, compensation for the parasitic capacitance may come at a cost of valuable and limited chip area.

SUMMARY

According to one general aspect, an apparatus includes a first resistor in a first current path of a resistor-capacitor (RC) circuit, the resistor connected to a power source. A variable capacitor is included in a second current path of the RC circuit and operably connected to the power source and a virtual ground generator. A comparison circuit is configured to make a determination regarding a voltage VR across the resistor to a ground relative to a voltage VC across the capacitor to a virtual ground from the virtual ground generator. A control circuit is configured to make an adjustment of a value of the variable capacitor, based on the determination.

According to another general aspect, a method includes providing a resistor in a first current path of a resistor-capacitor (RC) circuit. A variable capacitor is provided in a second current path of the RC circuit. A virtual ground is provided on one side of the variable capacitor. A voltage VR across the resistor to the ground is compared with a voltage VC across the capacitor to the virtual ground after a period of time. A value of the variable capacitor is changed if the voltage VR and the voltage VC are not the same after the period of time.

According to another general aspect, a circuit includes a resistor in a first current path of an RC circuit. A capacitor is included in a second current path of the RC circuit. A current mirror is included in the first and/or the second current paths that is configured to maintain a substantially equivalent current in both the first and the second current paths. An operational amplifier is included having the resistor and the capacitor connected to inputs thereof, and having the capacitor connected in a feedback loop of the operational amplifier.

The details of one or more implementations are set forth in the accompanying drawings and the description below. Other features will be apparent from the description and drawings, and from the claims.

DETAILED DESCRIPTION

Figure 1:
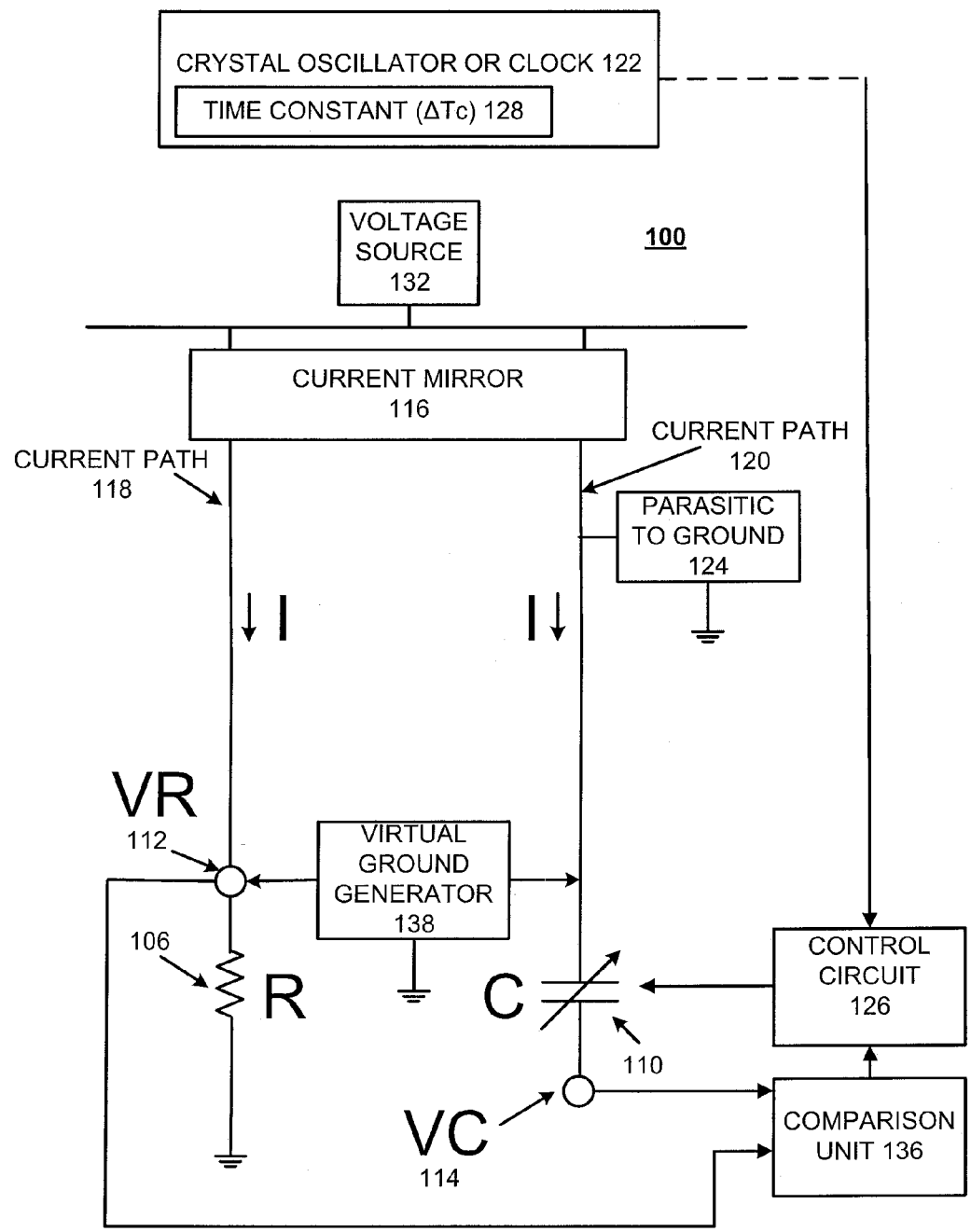
FIG. 1 is a circuit diagram of an example circuit that may be used for calibration using a time constant.

FIG. 1 is a circuit diagram of an example circuit 100 that may be used for calibration using a time constant. In the RC circuit of FIG. 1, a capacitor 110 has a capacitance (C), which is variable, and controlled so as to perform its functionality in an accurate, constant, and/or calibrated time period, which in turn allows for predictable and reliable characteristics for the circuit 100 as a whole (and in relation to other, connected circuits). Moreover, a virtual ground generator 138 may be used to establish a virtual ground between a terminal of the capacitor 110 and a current mirror 116, so that a parasitic capacitance 124 associated with the current mirror 116 and/or comparison unit 136 may be reduced or eliminated. For example, the virtual ground generator 138 may be connected so that the capacitance (C) of the capacitor 110 is between a voltage source 132 (or other power source) and the virtual ground generator 138. Accordingly, a size or space on an associated microchip that is devoted to the capacitance (C) of the capacitor 110 may be reduced. Further, a manufacturing cost of the RC circuit 100 may be reduced, and the RC circuit 100 thus provides an effective and cost-effective solution for calibration.

The RC circuit 100 includes a first current path 118 and a second current path 120. The current mirror 116 may be used so that a current (I) in the first current path 118 is substantially the same as a current (I) in the second current path 120. The parasitic capacitance 124 to ground may exist in the second current path 120, due to a structure and/or operation of the current mirror 116, comparison unit 136, and/or other associated circuits. For example, the current mirror 116 may generally be a circuit designed to copy a current flowing through a first device by controlling the current in another device of a circuit, thereby keeping both output currents constant. In addition, when current paths 118 and 120 need to be very precisely tuned, a correspondingly large size of the current mirror 116 may be needed to account for any potential process variations. The parasitic capacitance 124 to the ground generally increases when the size of the current mirror 116 is larger, so that increases in a desired precision of tuning paradoxically result in increased parasitic capacitances, as well.

The currents (I) pass through the resistor 106 and the capacitor 110, resulting in voltages VR and VC at nodes 112 and 114, respectively. The voltage source 132 is associated with the RC circuit 100. The voltage(s) across the resistor 106 and the capacitor 110 may be forced to be the same voltage by a feedback mechanism including the comparison unit 136, the control circuit 126, and/or the virtual ground generator 138. If the current mirror 116 causes current in the first and second current paths 118 and 120 to be equal, then it may be shown that a time constant of the RC circuit 100 is equivalent to R*C. For example, if $\Delta VR=I*R$ and $\Delta VC=I*(\Delta T/C)$, which simply represent the essential current/voltage relationships of resistors and capacitors respectively, then it may be seen that, if $\Delta VR=\Delta VC$, as in the assumption above, then $\Delta T=RC$, where $\Delta T$ may thus be seen to represent the time constant of the RC circuit 100.

In practice, temperature or process variations may result in a different time constant. That is, for example, an actual value of R and/or C may vary from expected or ideal values, due to a manner in which R and/or C are made in the RC circuit 100. Nonetheless, a clock 122 with a very accurate timing (e.g., a crystal oscillator) may be used so that the RC circuit 100 may be calibrated to have a precise time constant $\Delta Tc$ in order to provide an accurate and reliable transfer function for an associated RC filter (not shown in its entirety in FIG. 1) or other RC-circuit based circuits.

For example, the capacitor 110 may be variable or adjustable, and the RC circuit 100 may include a control circuit 126 that is configured to adjust the capacitor 110 in order to ensure that it functions, or during calibration that it obtains an equivalence of VR and VC, after a given time period. Of course, it should be understood that the capacitor 110 is shown as a single capacitor in the example of FIG. 1, for the sake of simplicity, but may represent or include at least one capacitor, i.e., may include an array of capacitors. Moreover, a total value of the (at least one) capacitor 110 may be adjusted by connecting or disconnecting one or more of the capacitors.

The control circuit 126 may vary a value of the capacitance (C) of the capacitor 110, e.g., in response to an output of a comparison circuit 136. For example, depending on when and whether VR=VC, as determined by the comparison circuit 136, the control circuit 126 may adjust a value of the capacitance (C) of the capacitor 110 accordingly, until a value of $\Delta T=R*C$, as is needed to achieve a successful calibration. At this point, the control circuit 126 may report a notification of calibration to the control circuit 126 or to other components of the system.

In the example of FIG. 1, however, the just-described process for calibrating the circuit using a time constant are not affected by the parasitic capacitance 124, which is associated with, for example, the current mirror 116. It may be seen that, as described in more detail below, the parasitic capacitance is reduced or eliminated, as compared to a situation where the virtual ground generator 138 is not utilized. With the parasitic capacitance 124 reduced or eliminated, then, for a given time constant, a size of the capacitance (C) of the capacitor 110 may be significantly reduced (of course, in such a case, a size/value of the resistor R may need to be increased during design/build time, in order to maintain a constant/expected time constant). By reducing a size of the capacitance (C) of the capacitor 110, an area on the associated chip may be conserved, and the RC circuit 100 may be constructed, for example, on a chip, in a reliable and cost-effective manner.

Thus, to calibrate the RC circuit 100, the time constant 128 may be used. The clock 122, for example, may include a crystal oscillator, and may be an electronic circuit that uses the mechanical resonance of a physical crystal of piezoelectric material along with an amplifier and feedback to create an electrical signal with a very precise frequency.

In operation, then, the same currents (I) in the first and second current paths 118 and 120 are used to charge the resistor 106 and the capacitor 110 for a given time period $\Delta Tc$. If a voltage reading at the output voltage node VC 114 is greater than a voltage reading at the output voltage node VR 112 (VC>VR) after the time period $\Delta Tc$ (meaning that the actual charging of the capacitor during the time period $\Delta Tc$ did not achieve calibration of the circuit), then the value of capacitor 110 should be decreased. Similarly, if a voltage reading at the output voltage node VC 114 is less than a voltage reading at the output voltage node VR 112 (VC<VR) after the time period $\Delta Tc$, then the value of capacitor 110 should be increased. If $\Delta VR=\Delta VC$ after the time period $\Delta Tc$, then R*C is equal to the time constant 128 (i.e., to $\Delta Tc$), as described above, so the circuit 100 performs as expected during the time period $\Delta T$ and no further adjustments to the capacitor 110 are needed, and the calibration may be completed and a notification and/or a set of resulting calibration codes thereof may be output to the control circuit 126, for example, or other system components.

Figure 2:
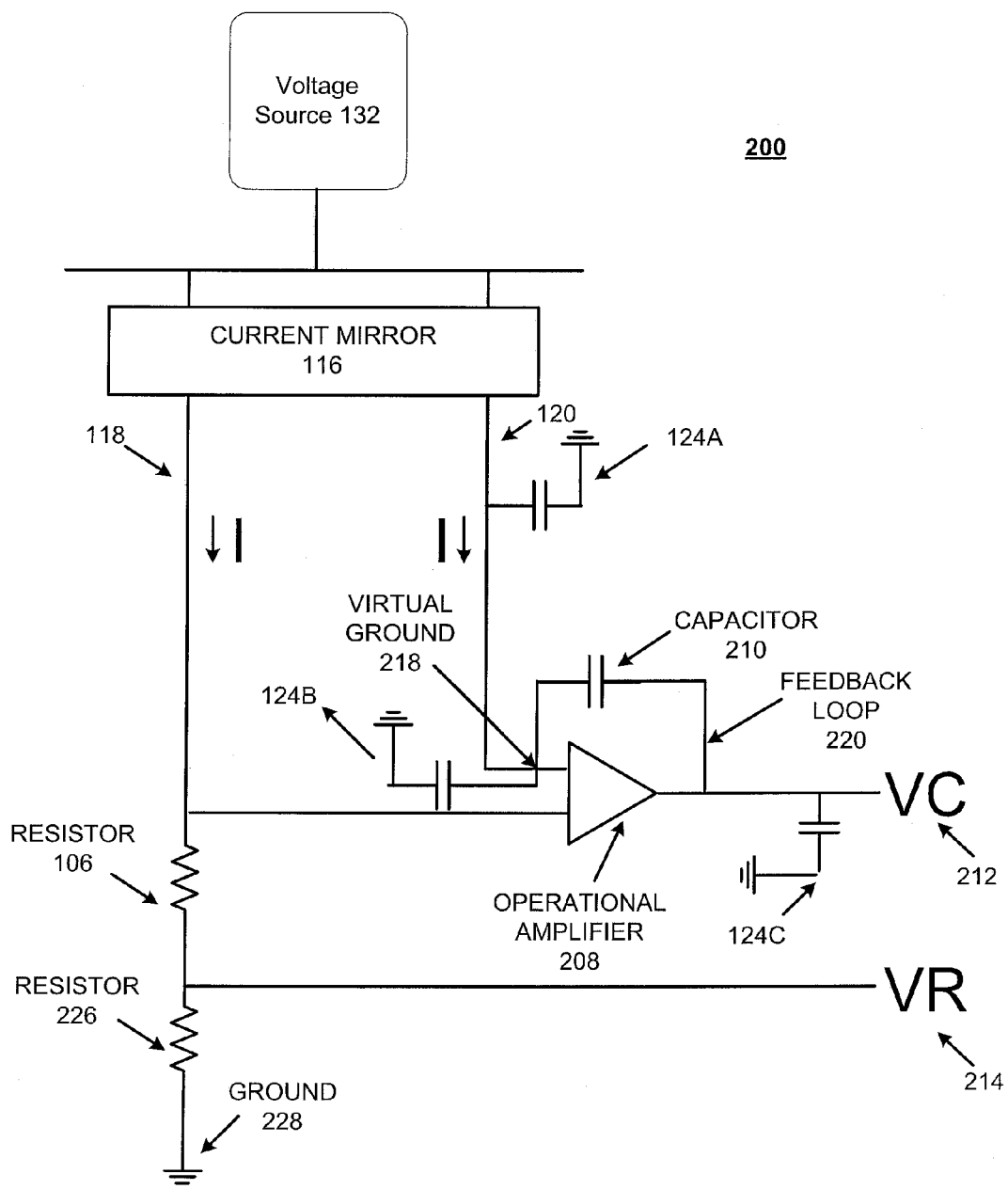
FIG. 2 is a circuit diagram of a second example circuit that may be used for calibration using a time constant.

FIG. 2 is a circuit diagram of a second example circuit that may be used for calibration using a time constant. Since FIG. 2 is intended merely to illustrate an example implementation for obtaining a virtual ground 218, a full illustration of an operation of the system 100 is not illustrated with respect to FIG. 2 (e.g., elements corresponding to the control circuit 126, the comparison circuit 136, and the clock 122 are not illustrated in FIG. 2), but are discussed in more detail below with respect to FIGS. 3-6.

In FIG. 2, then, an operational amplifier 208 is included, and a capacitor 210 is connected in a feedback loop from an output of the operational amplifier 208 to an input thereof. Meanwhile, the second input of the operational amplifier 208 is connected to a node of the resistor 106, as shown. The large open-loop gain of the operational amplifier 208, together with the negative feedback loop provided by the capacitor 210, forces essentially the same voltage potential at two inputs of the operational amplifier 208, which forces a node to operate as the virtual ground 218. Thus, at least the operational amplifier 208 and/or the capacitor 210 may be seen to operate as an example of the virtual ground generator 138. An additional resistor 228 may be connected between the resistor 106 and a ground 228, as shown.

Accordingly, the description above of calibrating the RC circuit 200 continues to apply, e.g., the capacitor 210 may be varied until the actual properties of the circuit 200 exist after being activated for a time period, as defined by the RC time constant. However, due to the virtual ground 218, a voltage difference across a parasitic capacitance 124A and a parasitic capacitance 124B (which may be associated with the output of the current mirror 116 and the input of the operational amplifier 208 respectively) are effectively eliminated, so that the parasitic capacitances 124A and 124B are reduced or eliminated. Due to a low output impedance of the operational amplifier 208, the parasitic capacitance 124C (which may be associated with the output of the operational amplifier 208 and the input of the following stages) may also be reduced or eliminated.

For example, the current mirror 116 may be implemented using PMOS transistors, which are appropriately biased so as to cause both currents (I) in the first and second current paths 118 and 120 to be substantially equivalent to one another in the presence of the voltage source 132. In this example, the part of the parasitic capacitance 124A may appear across an electrically-conductive region(s) of the PMOS transistor to ground. Of course, other current mirrors may be used, such as, for example, cascode current sources. In addition, it also includes parasitic capacitances 124B coming from the input capacitance of the operational amplifier 208.

Because the parasitic capacitances 124A, 124B, and 124C are significantly reduced or eliminated, a capacitance value(s) needed for the capacitor 210 may be reduced, since there is little or no need to attempt to minimize an effect of the parasitic capacitance by sheer size of the capacitor 210. Correspondingly, the silicon area on the chip needed to provide an effective capacitance value for the capacitor 210 is considerably small, thereby conserving valuable space on the chip and/or increasing a cost-effectiveness of producing the chip. Of course, for a reduced value of the capacitor 210, it may be necessary to increase a value of the resistor R 106 to maintain the same time constant $\Delta T_c$, as referenced above, since the time constant equals R*C. However, the increased size and value of the resistor R 106 is generally negligible compared to the savings of space obtained from reducing the value of the capacitor 210.

When the circuit 200 is being calibrated, the capacitor 210 is charged (or discharged). Due to temperature fluctuations or process variations in making the resistor 106 and the capacitor 210 of the RC circuit 200. Their values may vary from the ideal or desired ones. Therefore, as described herein, a value of the capacitor 210 may be adjusted until the voltage drop across the capacitor 210 converges in value with and may become equal to the voltage drop across the resistor 106. This results in a fixed time constant $\Delta T$ regardless of above mentioned component variations. At this point the RC circuit 200 is considered calibrated, so the notification of the completion and/or a set of resulting calibration codes can be sent to, for example to the control circuit 126 shown in FIG. 1, or to other system components e.g., filters (not shown). The components that need to be calibrated are required to have the same RC structure as the calibration circuits to achieve the best results. Thus, transfer functions of an associated RC filter may be determined with accuracy.

Figure 3:
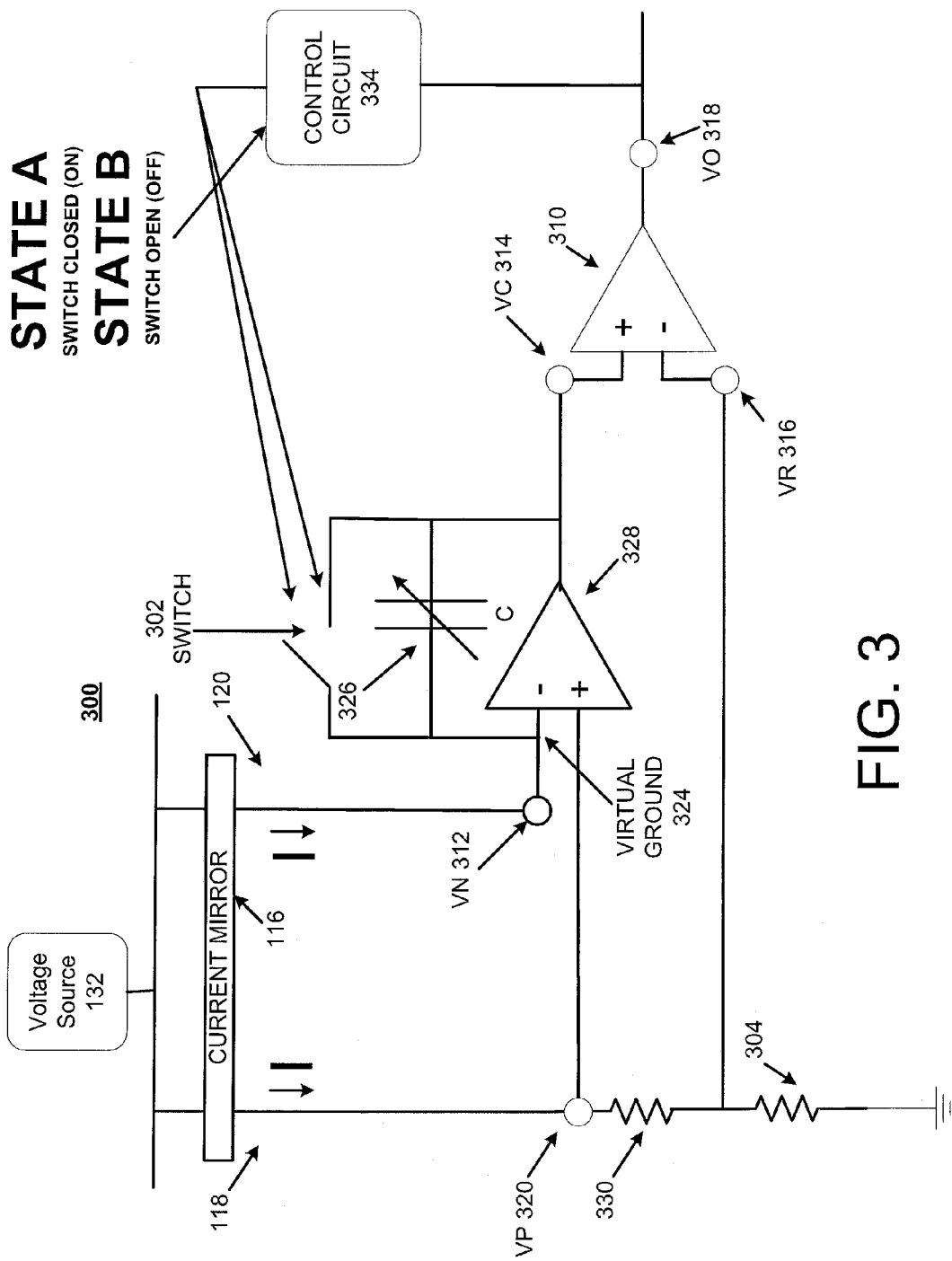
FIG. 3 is a circuit diagram of a third example circuit that may be used for calibration using a time constant.

FIG. 3 is a third circuit diagram of a third example circuit that may be used for calibration using an RC time constant. The RC circuit 300 generally illustrates a specific example of the configuration of the circuit of FIG. 2 in the RC circuit 100 of FIG. 1, in which an operational amplifier is used to establish a virtual ground and thereby reduce or eliminate parasitic capacitances associated with a current mirror, operational amplifier, and/or other circuit elements.

Thus, circuit 300 includes the current path 118 and the current path 120, which establish voltages VR 316, VP 320, and VC 314, as shown. As already described, the current mirror 116 may be used so that a current (I) in the second current path 120 is substantially the same as, or equal to, a current (I) in the first current path 118. The circuit 300 also includes a capacitor 326, which is usually a capacitor array, an operational amplifier 328, and a switch 302, which are connected as shown. Voltage node VP 320 may be established at the positive input of the operational amplifier 328, while the negative input may be associated with a voltage node VN 312.

The switch 302 may be, for example, a transistor. If the switch 302 is a transistor, then the switch 302 may be opened or closed by appropriate biasing of the transistor, so that the transistor transitions between states of being fully on and fully off. In the fully on state the voltage across the transistor is almost zero (an effective short circuit), while in the fully off state may act as an effective open circuit.

A comparator 310 compares the voltages VC 314 and VR 316 and outputs a voltage at node VO 318. The control circuit 334 is configured to control the switch (e.g., using an appropriate control register), so as to open or close the switch 302. For example, when the control circuit 334 causes the switch 302 to be ON or closed (state A), then the shorting of the I/O of the operational amplifier 328 (i.e., of the capacitor 326) occurs. When the I/O of the operational amplifier 328 is shorted, output voltage node VP 320=output voltage node VN 312=output voltage node VC 314. (VP=VN=VC). Conversely, when the control circuit 334 causes the switch 302 to be OFF or open (state B), the input current (I) in the current path 120 starts charging the capacitor 326. When this happens, output voltage node VC 314=output voltage node VN 312−input current (I)*$\Delta T$/capacitor 326 (that is, VC=VN−(I*$\Delta T$/C)).

As also shown in FIG. 3, the control circuit 334 may be used to control a value of the adjustable capacitor 326. For example, the control circuit may connect or disconnected additional capacitors (not shown) in series or in parallel with the capacitor 326, so as to decrease/increase a total value of capacitance seen between VC 314 and VN 312. Of course, other techniques for varying capacitance may be used, and there may be separate control circuits for operating the switch 302 and the capacitor 326.

Figure 4:
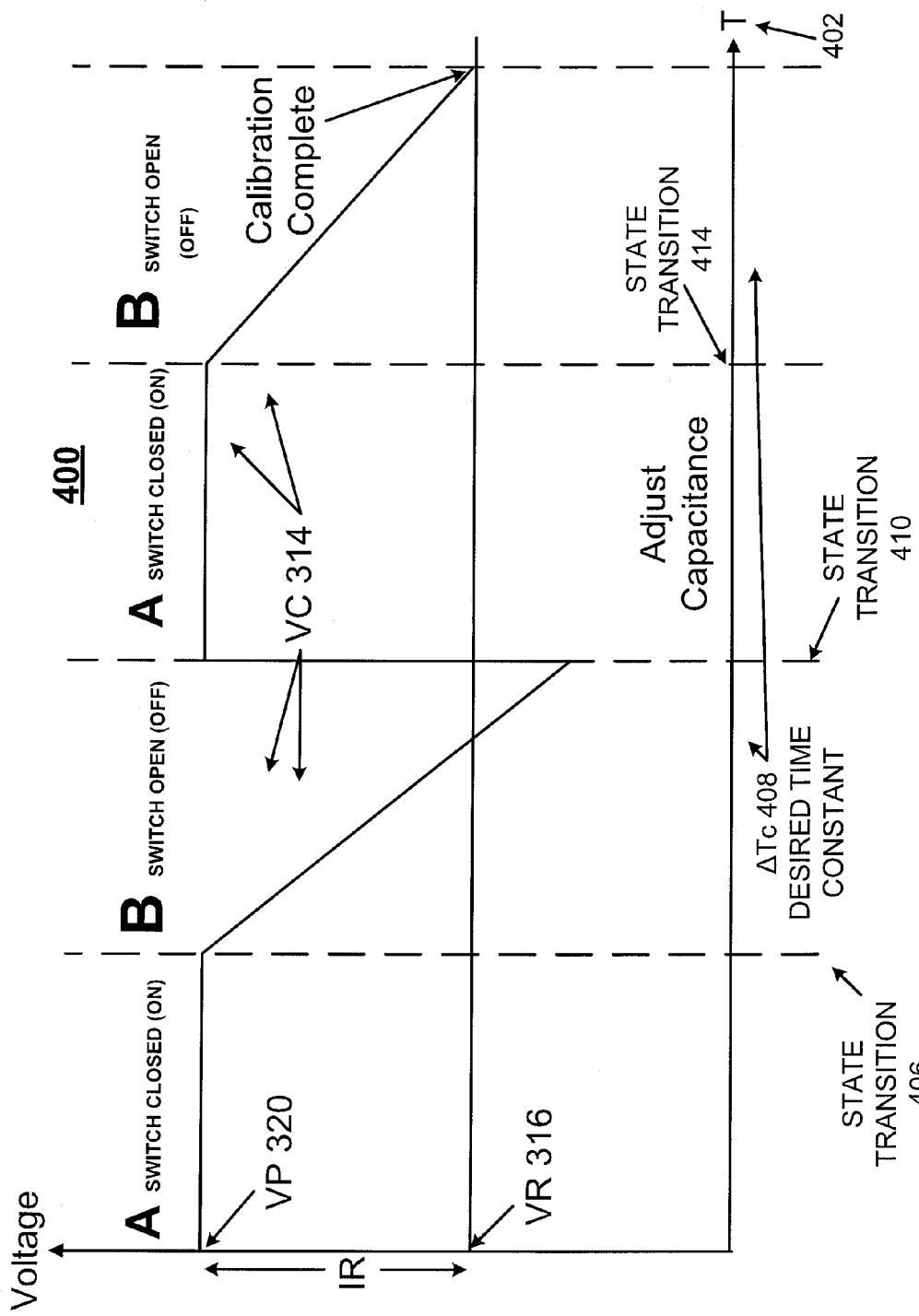
FIG. 4 is a chart showing a change in voltage over time in a circuit that may be used for calibration using a time constant, such as may occur in the circuits of FIGS. 1-3.

An operation of the circuit of FIG. 3 is provided below with respect to FIG. 4. Specifically, FIG. 4 is a chart showing a change in voltage over time in a circuit that may be used for calibration using an RC time constant, such as the RC circuit 300 of FIG. 3, and/or other variations of the circuits of FIGS. 1 or 2. The x-axis of the chart 400 is time T 402, which may be measured with reference to the clock 122. The y-axis of the chart 400 shows voltage, e.g., the voltage at node VC 314.

When a switch, such as switch 302 shown in FIG. 3, is closed, VP=VN=VC. Therefore, VP=VC, so the level of voltage node VC 314 on the y-axis of the chart 400 remains constant while in state A (switch closed).

When a state transition 406 occurs, the control circuit 334 opens the switch (turning it off) and the system enters state B. In state B, the capacitor 326 starts to get charged. Because of the polarity, the charging of the capacitor is shown as a negative slope in the area between the state transition 406 and a state transition 410. Typically, the capacitor is charged for a time $\Delta T_c$ 408, which may be made very precise and may be defined as the inverse of a crystal oscillator frequency, for example. After the time ΔTc 408 the switch may be closed and state A is re-entered.

By definition, and by the equations shown above, the time period ΔTc 408 is used to charge the capacitor 326. At the end of the duration of the time period ΔTc 408, VR should equal VC (as determined by the comparator 310) if the circuit is calibrated. i.e., the desired results are produced in the circuit after the time period ΔTc 408, in the context of whatever temperature fluctuations or other irregularities may exist, which may cause the value of R*C to not be as desired. Thus, the control circuit 334 may be configured to determine whether the actual properties of the RC circuit achieve the desired results after the time period ΔTc 408.

In the example of FIG. 4, it is shown that the circuit calibration is not successful between the state transitions 406 and 410, because the slope of the charging of the capacitor is too steep and it does not meet the voltage VR after the time period ΔTc 408, and so the cycle repeats itself with a transition to state A, with the switch closed (on). Here again the capacitor 326 is short-circuited until adequately discharged, and, during this time, the control circuit 334 may adjust a value of the (variable) capacitor 326 up or down, as described herein, until a state transition 414 occurs, after which time another cycle of charging the capacitor 326 for the time period ΔTc 408 occurs. The cycle taking place after the state transition 414 represents a successful calibration because after the time period ΔTc 408, VR=VC, so the adjustment to the value of the (variable) capacitor 326 was the correct adjustment, resulting in a set of calibration codes, for example, if it is digitally controlled. The calibration codes may be used, for example, by circuits that require an accurate RC time constant. The present example shows two cycles in the calibration process. In actuality, there may be a number of cycles that may occur in other instances.

Figure 5:
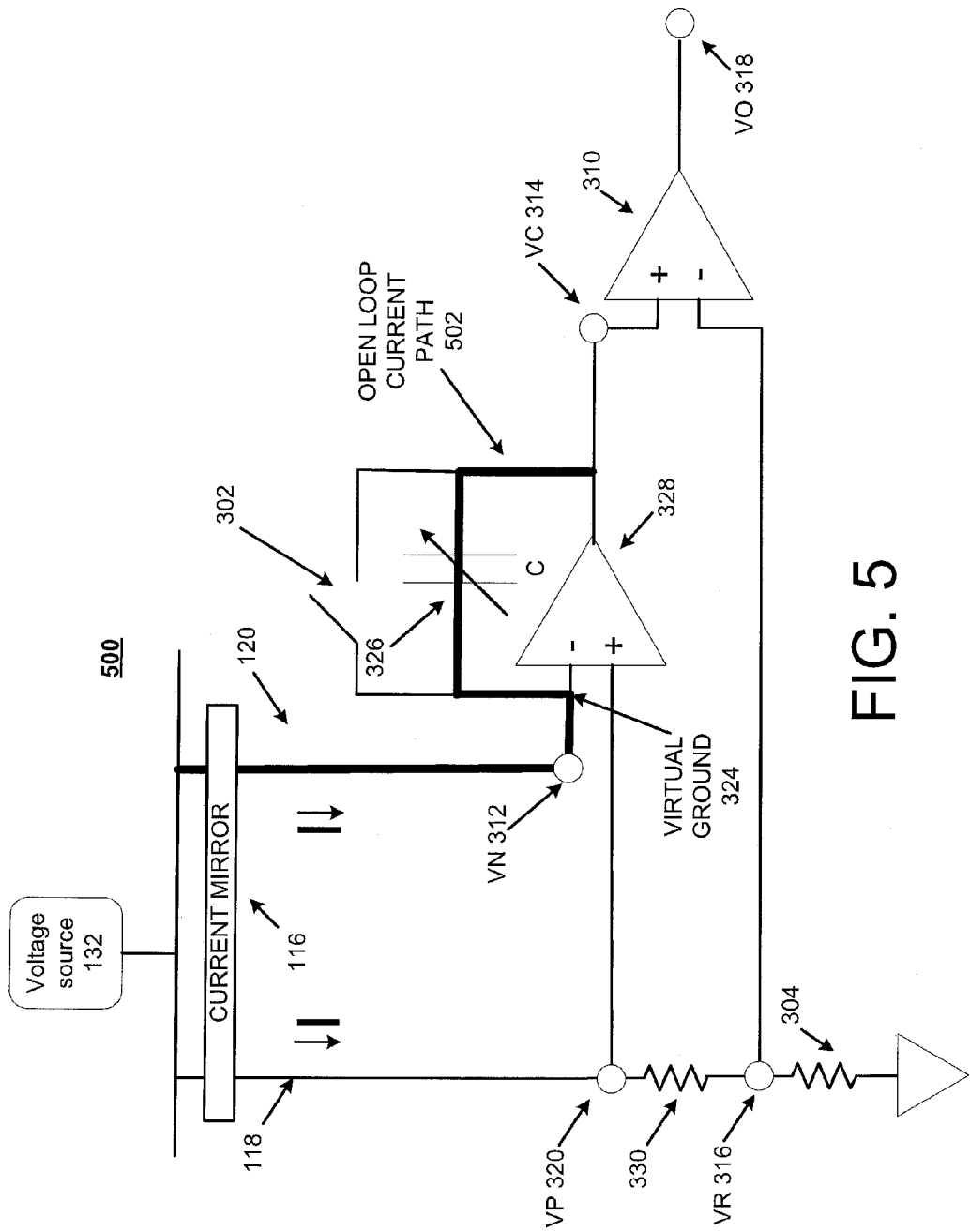
FIG. 5 is a circuit diagram illustrating a current flow experienced by the circuit 300 of FIG. 3.

FIG. 5 is a circuit diagram illustrating a current flow experienced by the circuit 300 of FIG. 3 during charging of the capacitor 326. Circuit 500 includes a current path 118 and a current path 120. As described, the current mirror 116 may be used so that a current (I) in the first current path 118 is substantially the same as, or equal to, a current (I) in the second current path 120. The resistor 330 is chosen so that the voltage drop I*R is equal to the charging voltage I*ΔTc/C.

In FIG. 5 the switch 302 is in an open loop mode and the capacitor 326 is charging (state B). FIG. 5 is used to illustrate the open loop mode current path 502 between a comparator 310 and the current (I) toward the source. When the capacitor 326 charges to the point that the voltage at the comparator 310, VC, is equal or substantially equal to the voltage VR at the comparator 310, then the comparator will output a voltage at a voltage node VO 318, so a RC circuit calibration may be determined, as described above with respect to FIG. 4, and again herein below with respect to FIG. 6.

Figure 6:
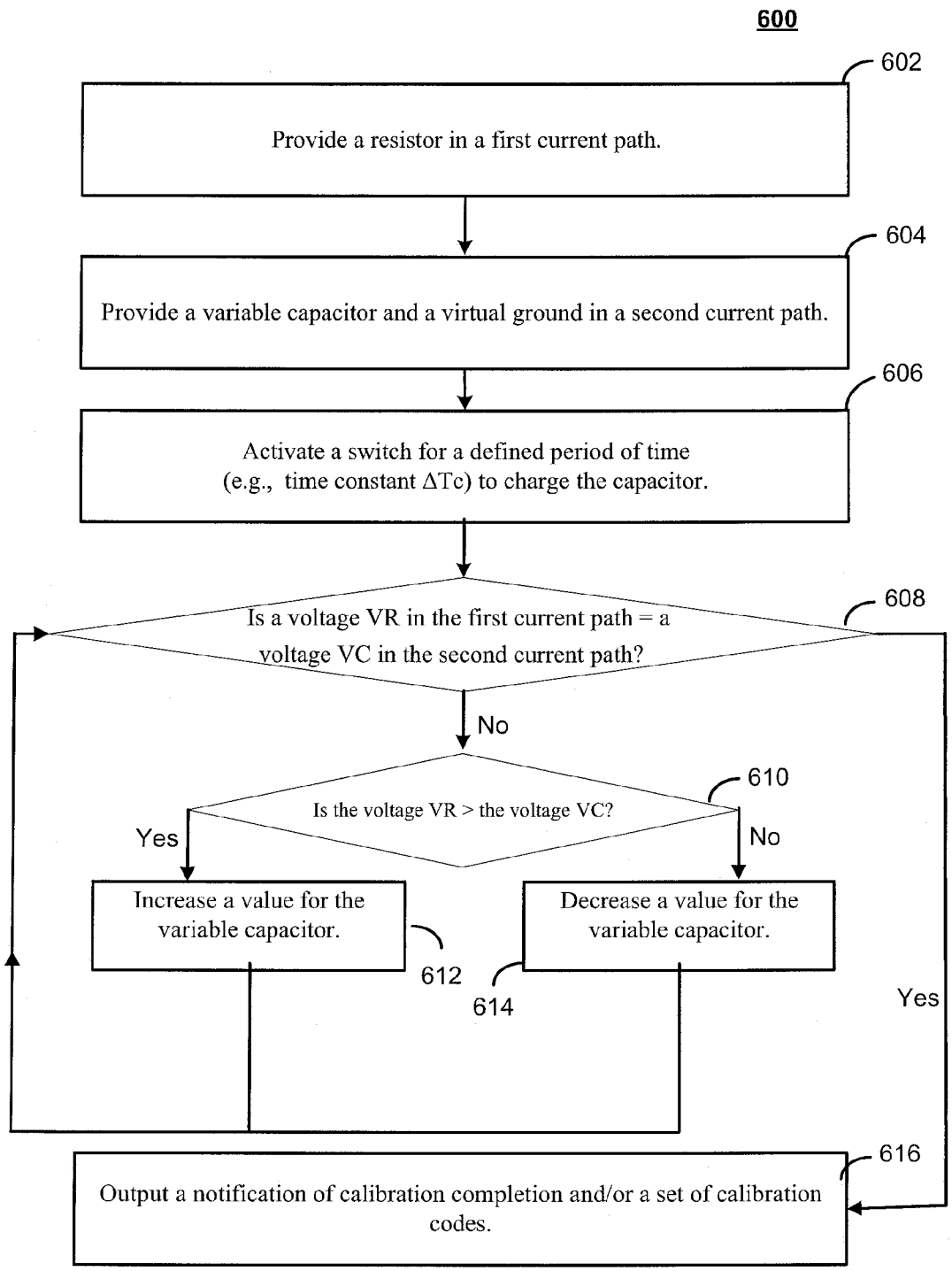
FIG. 6 is a flowchart illustrating an example process for calibration using a time constant.

FIG. 6 is a flowchart 600 illustrating an example process for calibration using an RC time constant. A resistor is provided in a first current path (602). A variable capacitor and virtual ground are provided in a second current path (604). Of course, as shown and described above, the virtual ground may be established with respect to the resistor in the first current path, as well.

Then, the switch 302 controlled by the control circuit 126 may be activated for a defined period of time, causing a current to appear across the capacitor (606). The defined time may be the time constant ΔTc. In this way, at the end of the defined period of time, the control circuit may determine whether VC=VR or, more particularly, whether VC is less than or greater than VR. If, for example, the comparator 310 determines that, in fact, VR is not equal to VC after the defined period of time (608), then the control circuit may determine whether VR is greater than VC (610), in which case the control circuit may increase a value of the variable capacitor (612). Otherwise, if VR is less than VC (610), then the control circuit may decrease a value of the variable capacitor (614). If, after the defined time, VR=VC, then the control circuit 334 may output a notification of calibration completion and/or a set of calibration codes (616), e.g., to the control circuit 126 or to other system components.

It should be understood that with respect to the operations involved in FIG. 6, that a waveform, such as that shown with respect to FIG. 4, may be produced. In FIG. 6, the operation 606 activates a voltage source for a defined period of time. In this example, the defined period of time (time constant) is fixed, so state B would always cover a fixed distance on the x-axis, but the slope of the line VC 314 in state B would change each time the capacitors are adjusted, since the line VC 314 represents a voltage measurement caused by the adjusted capacitors. For example, if the operations of FIG. 6 produced a capacitor array that was too small to achieve the state VR=VC at the state transition 410, then the slope of the line VC might change. In such case the capacitor would be adjusted, discharged, and/or re-tested for the same time period. The process would repeat until the slope of the line VC 314 met precisely at the point whose y component is VR 314, at which time the circuit has been successfully calibrated.

While certain features of the described implementations have been illustrated as described herein, many modifications, substitutions, changes and equivalents will now occur to those skilled in the art. It is, therefore, to be understood that the appended claims are intended to cover all such modifications and changes as fall within the true spirit of the embodiments of the invention.

What is claimed is:

1. An apparatus comprising:
   a resistor in a first current path of a resistor-capacitor (RC) circuit, the resistor connected to a power source;
   a variable capacitor in a second current path of the RC circuit and operably connected to a current mirror and a virtual ground generator;
   a comparison circuit configured to make a determination regarding a voltage VR across the resistor to a ground, relative to a voltage VC across the capacitor to a virtual ground from the virtual ground generator; and
   a control circuit configured to make an adjustment of a value of the variable capacitor, based on the determination.

2. The apparatus of claim 1 wherein the current mirror is configured to cause the first current path and the second current path to have substantially the same current.

3. The apparatus of claim 1 wherein the comparison circuit is configured to make the determination, including whether the voltage VR is substantially equivalent to the voltage VC, based on a time period.

4. The apparatus of claim 1 wherein the control circuit is configured to make the adjustment in response to the determination indicating non-equivalence of the voltage VR and the voltage VC, after a passing of a time period.

5. The apparatus of claim 1 wherein the control circuit is configured not to make the adjustment in response to the determination, when the determination indicates substantial equivalence of the voltage VR and the voltage VC, after a passing of a time period and/or to output a notification of calibration completion and/or a set of calibration codes based on the indication of substantial equivalence.

6. The apparatus of claim 1 wherein the comparison circuit includes a comparator having the voltage VR and the voltage VC as inputs.

7. The apparatus of claim 6 wherein the control circuit is configured to make the adjustment, based on an output of the comparator.

8. The apparatus of claim 1 wherein the virtual ground generator is configured to establish the virtual ground between the current mirror, an operational amplifier, and the variable capacitor.

9. The apparatus of claim 1 comprising a switch connected in parallel with the variable capacitor, wherein the control circuit is configured to operate the switch so as to initiate current in the second current path for use by the comparison circuit in making the determination.

10. The apparatus of claim 1 comprising an operational amplifier having the virtual ground established at an input thereof, and having the capacitor connected in a feedback loop of the operational amplifier.

11. The apparatus of claim 1 wherein the power source includes a direct current (DC) voltage source.

12. A method comprising:
providing a resistor in a first current path of a resistor-capacitor (RC) circuit;
providing a variable capacitor in a second current path of the RC circuit;
providing a virtual ground on one side of the variable capacitor;
activating a switch for a period of time;
comparing a voltage VR across the resistor to the ground with a voltage VC across the capacitor to the virtual ground after the period of time; and
changing a value of the variable capacitor if the voltage VR and the voltage VC are not the same after the period of time.

13. The method of claim 12 comprising:
determining that the voltage VR and the voltage VC are substantially the same after the period of time; and
providing a notification of calibration completion and/or a set of calibration codes of the RC circuit, based on the determination.

14. The method of claim 12 wherein providing the resistor and providing the variable capacitor comprise providing a current mirror configured to maintain an equivalence of current in the first current path and the second current path.

15. The method of claim 12 wherein activating the switch comprises opening and/or closing a switch connected in parallel across the variable capacitor.

16. The method of claim 12 wherein providing a virtual ground comprises:
providing an operational amplifier having the variable capacitor connected in a feedback loop between an output and an input thereof, and having the resistor connected to the input thereof,
wherein the virtual ground is established at the input of the operational amplifier.

17. A circuit comprising:
a resistor in a first current path of an RC circuit;
a capacitor in a second current path of the RC circuit;
a current mirror in the first and second current path that is configured to maintain a substantially equivalent current in both the first current path and the second current path; and
an operational amplifier having the resistor connected to an input thereof, and having the capacitor connected in a feedback loop of the operational amplifier.

18. The circuit of claim 17, comprising:
a control circuit configured to:
receive a clock signal to the RC circuit;
cause a current through the capacitor while the clock signal is being received;
measure a voltage across the resistor and a voltage across the capacitor after the clock signal; and
determine whether the voltage across the resistor and a voltage across the capacitor are equivalent.

19. The circuit of claim 18 wherein the control circuit is configured to determine that the voltage across the resistor and a voltage across the capacitor are not equivalent, and in response to adjust a value of the capacitor.

20. The circuit of claim 18 wherein the control circuit is configured to determine that the voltage across the resistor and a voltage across the capacitor are equivalent, and in response to output a notification of calibration completion.

* * * * *